US009746136B2

(12) United States Patent
Takashima

(10) Patent No.: US 9,746,136 B2
(45) Date of Patent: Aug. 29, 2017

(54) ILLUMINATION DEVICE HAVING MULTIPLE LED ELEMENTS WITH VARYING COLOR TEMPERATURES

(75) Inventor: Jun Takashima, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 1532 days.

(21) Appl. No.: 12/685,069

(22) Filed: Jan. 11, 2010

(65) Prior Publication Data

US 2010/0200872 A1 Aug. 12, 2010

(30) Foreign Application Priority Data

Jan. 9, 2009 (JP) ................................ 2009-003768

(51) Int. Cl.

| | |
|---|---|
| ***H01L 33/00*** | (2010.01) |
| ***H01L 29/20*** | (2006.01) |
| ***F21K 9/00*** | (2016.01) |
| *F21Y 105/12* | (2016.01) |
| *F21Y 105/10* | (2016.01) |
| *F21Y 115/10* | (2016.01) |
| *F21Y 113/13* | (2016.01) |

(52) U.S. Cl.

CPC ............. *F21K 9/00* (2013.01); *F21Y 2105/10* (2016.08); *F21Y 2105/12* (2016.08); *F21Y 2113/13* (2016.08); *F21Y 2115/10* (2016.08)

(58) Field of Classification Search

CPC ..... H01L 2224/48091; H01L 2924/181; H01L 2924/00012; H01L 2924/00014; H01L 2224/73265; H01L 25/0753; H01L 33/54; F21K 9/00; H05K 2201/10106; H05K 3/284

USPC ....... 257/88, 98, E33.056, E33.061, E27.12; 438/26–28, 34, 35; 362/84, 184, 293; 349/71

See application file for complete search history.

(56) References Cited

U.S. PATENT DOCUMENTS

2009/0001392 A1* 1/2009 Lee ................................ 257/89
2009/0002604 A1* 1/2009 Morimoto ....................... 349/71

FOREIGN PATENT DOCUMENTS

JP 2006156192 9/2005
JP 2008218485 A * 9/2008

* cited by examiner

*Primary Examiner* — Meiya Li

(74) *Attorney, Agent, or Firm* — Patterson Intellectual Property Law, P.C.; Mark J. Patterson; Gary L. Montle

(57) ABSTRACT

An illumination device is provided with an arrangement for reducing color unevenness. A plurality of light-emitting devices are provided, each of which includes a transparent enclosure sealing a light-emitting element and further including a phosphor excited by light emitted from the light-emitting element. A substrate is provided upon which the plurality of light-emitting devices are mounted. The light-emitting devices are provided with predetermined color temperatures that vary in accordance with their position along the substrate to reduce color unevenness, for example increasing in a phased manner from the center of the substrate toward the outer circumference thereof.

6 Claims, 8 Drawing Sheets

ILLUMINATION DEVICE HAVING MULTIPLE LED ELEMENTS WITH VARYING COLOR TEMPERATURES

CROSS-REFERENCES TO RELATED APPLICATIONS

This application claims benefit of the following patent application(s) which is/are hereby incorporated by reference: Japan Patent Application No. 2009-003768, filed Jan. 9, 2009.

A portion of the disclosure of this patent document contains material that is subject to copyright protection. The copyright owner has no objection to the reproduction of the patent document or the patent disclosure, as it appears in the U.S. Patent and Trademark Office patent file or records, but otherwise reserves all copyright rights whatsoever.

STATEMENT REGARDING FEDERALLY SPONSORED RESEARCH OR DEVELOPMENT

Not Applicable

REFERENCE TO SEQUENCE LISTING OR COMPUTER PROGRAM LISTING APPENDIX

Not Applicable

BACKGROUND OF THE INVENTION

The present invention relates to illumination devices. More particularly, the present invention relates to illumination devices provided with a plurality of light-emitting devices which includes in a resin case a light emitter excited by light from a light-emitting element, and which seals the light-emitting element within this resin case.

A light source for some illumination devices is a light-emitting diode (hereinafter referred to as "LED") serving as a light-emitting element. The illumination device of this type achieves higher output through light distribution control with a reflection plate or a lens for the purpose of obtaining high illumination intensity.

Frequently, such an illumination device includes a plurality of LED packages arranged on a substrate or a plurality of LED elements loaded within an encapsulated LED package as known to one of skill in the art.

Moreover, some illumination devices achieve a higher light output by performing light distribution control with a lens or a reflection plate when light distribution of an LED itself is wider than a desired light distribution.

Here, an LED of white or equivalent light bulb color used in the illumination device has an LED element which usually emits blue light (light in a wavelength range of approximately 380 to 480 nm) and which is sealed with an enclosure such as a phosphor-containing resin case made of silicon or epoxy, for example. With this illumination device, a part of the blue light excites a light-emitter included in the resin case to be converted into light in a wavelength of approximately 480 to 780 nm, while the rest of the blue light remains unconverted and transmitted through the resin case. Through the combination of light in a wavelength range of approximately 480 to 780 nm with the unconverted blue light in a wavelength range of approximately 380 to 480 nm, conversion into a desired color (for example, white) in the illumination device is made.

For the LED, a visible tint varies depending on an irradiation direction of the LED. For example, a white LED appears bluish-white in the vicinity of a center of the irradiation surface and appears more yellowish with distance from the center, so that a yellow ring appears at an outer circumference in some cases. Problems of color unevenness particularly arise in the event where a proximity position is irradiated by an illumination device provided with a white LED.

It may further be assumed that when a reflection plate or a lens is used for obtaining high illumination intensity, or when an LED (for example, an LED package loaded with a plurality of LED elements) with a large light-emitting portion is used, a problematic appearance of color unevenness becomes prominent.

In the first case where reflection plates or a lens are used, one possible countermeasure is subjecting the reflection plate or the lens to diffusion processing. However, this has led to a decrease in light extraction efficiency.

Moreover, using a reflection plate or a lens subjected to diffusion processing in the LED with a large light-emitting portion requires a very large lens or a reflection plate, thus resulting in failure to achieve a compact illumination device.

BRIEF SUMMARY OF THE INVENTION

An illumination device within the scope of the present invention is capable of reducing color unevenness without decreasing light extraction efficiency when a plurality of light-emitting devices are arranged on a substrate.

The illumination device of the present invention generally includes a light-emitting element, a plurality of light-emitting devices including a transparent enclosure such as a resin case sealing the light-emitting element, and also including a light-emitter excited by light emitted from the light-emitting element, and a substrate on which the plurality of light-emitting devices are mounted. The plurality of light-emitting devices are varied in a color temperature to reduce color unevenness.

The plurality of light-emitting devices may be arranged with the color temperature varying in a phased manner from a center of the substrate toward an outer circumference thereof.

As one example, the plurality of light-emitting devices may be arranged with the color temperature increasing in a phased manner from the center of the substrate toward the outer circumference thereof.

A plurality of light-emitting devices may be provided in a continuous manner. In other words, an arrangement of light-emitting devices may be provided with, for example, light-emitting devices of a first color temperature generally disposed along an inner portion of the arrangement and with light-emitting devices of a second and higher color temperature generally disposed about an outer portion of the array. Providing a plurality of the light-emitting units in a continuous manner to form the illumination device can reduce an appearance of color unevenness of the illumination device. This further has the advantage of permitting the illumination device to be formed in a wide variety of shapes such as for example a rectangle, thus widening its use.

Varying the plurality of light-emitting devices in color temperature can bring the color temperature at an outer circumferential portion closer to a color temperature at a center portion on an irradiation surface of the illumination device. Bringing the color temperature at the outer circumferential portion of the irradiation surface of the illumination device closer to the color temperature at the center portion thereof in this manner can reduce the appearance of color unevenness on the irradiation surface. This further eliminates the need for subjecting light emitted from the light-emitting devices to diffusion processing with a reflection plate or a lens. An associated decrease in light extraction efficiency may therefore be avoided.

The plurality of light-emitting devices which may be varied in color temperature in a phased manner from the center of the substrate toward the outer circumference thereof (including a condition where they are arranged with the color temperature increasing in a phased manner) may further be provided as a light-emitting unit. Consequently, an appearance of color unevenness on an irradiation surface of the light-emitting unit can be reduced.

The plurality of light-emitting devices may have a blue light-emitting diode as the light-emitting element and may further include phosphor of a white type including a yellow color. When the phosphor is of a white type, the color unevenness is generally likely to appear in the illumination device. Thus, varying the plurality of light-emitting devices in the color temperature in a phased manner from the center of the substrate toward the outer circumference thereof (including a condition where they are arranged with the color temperature increasing in a phased manner) can desirably reduce an appearance of color unevenness in the illumination device.

DETAILED DESCRIPTION OF THE INVENTION

Throughout the specification and claims, the following terms take at least the meanings explicitly associated herein, unless the context dictates otherwise. The meanings identified below do not necessarily limit the terms, but merely provide illustrative examples for the terms. The meaning of "a," "an," and "the" may include plural references, and the meaning of "in" may include "in" and "on." The phrase "in one embodiment," as used herein does not necessarily refer to the same embodiment, although it may.

Hereinafter, preferred embodiments of the present invention may be described with reference to the accompanying drawings.

Figure 1:
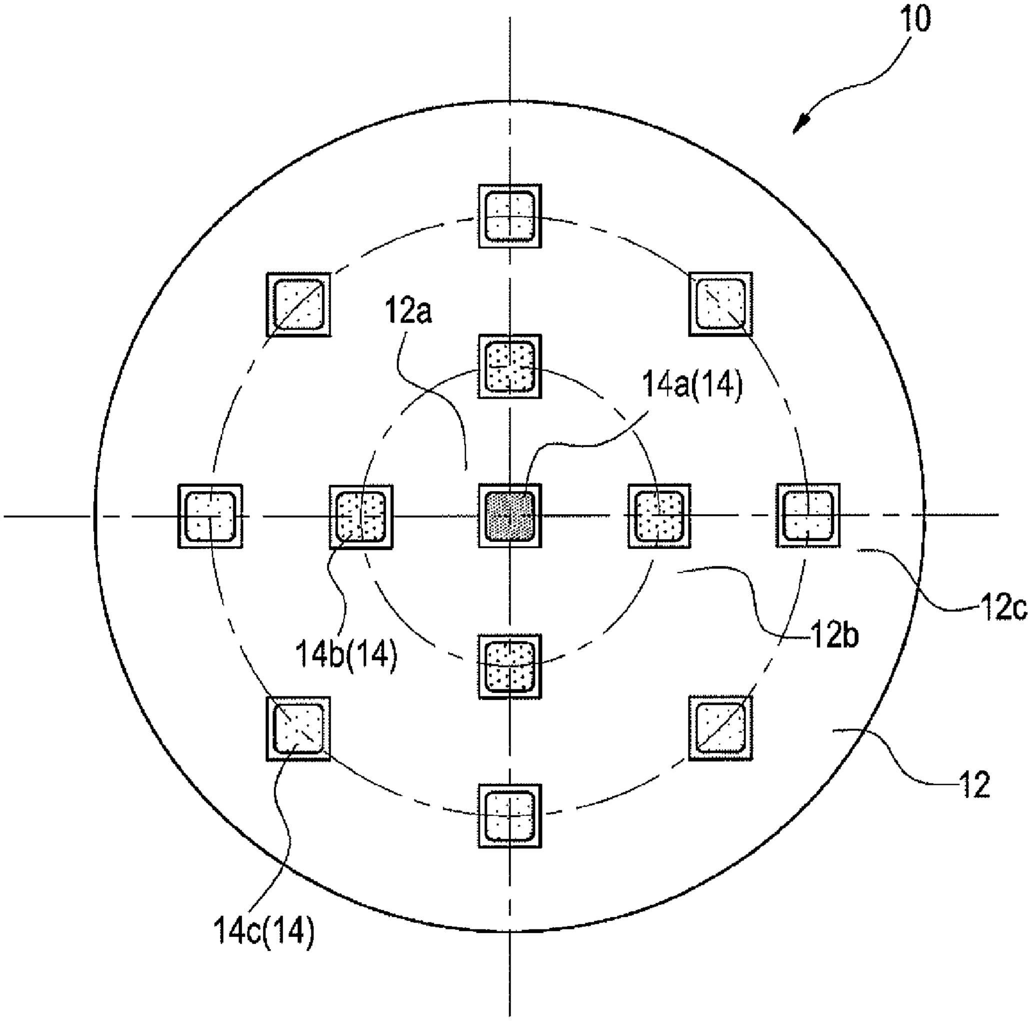
FIG. 1 is a top view of an illumination device in accordance with a first embodiment of the present invention.

Referring to FIG. 1, in an embodiment an illumination device 10 is provided with a substrate 12 formed into a disc-like shape and a plurality of light-emitting devices 14 mounted on the substrate 12.

The substrate 12 as shown is a component on which the plurality of light-emitting devices 14 are mounted concentrically at predetermined intervals. More specifically, the substrate 12 has a disk-like shape with a center position (center) 12*a*, a middle position 12*b* outside of the center position 12*a*, and an outer circumferential position (outer circumference) 12*c* outside of the middle position 12*b*, on which the plurality of light-emitting devices 14 are mounted.

The plurality of light-emitting devices 14 are provided with: one center light-emitting device (light-emitting device) 14*a* mounted at the center position 12*a* of the substrate 12; a plurality of middle light-emitting devices (light-emitting devices) 14*b* mounted at the middle position 12*b* outside of the center light-emitting device 14*a* at predetermined intervals; and a plurality of outer light-emitting devices (light-emitting devices) 14*c* mounted at the outer circumferential position 12*c* outside of the middle light-emitting devices 14*b* at predetermined intervals.

Figure 2:
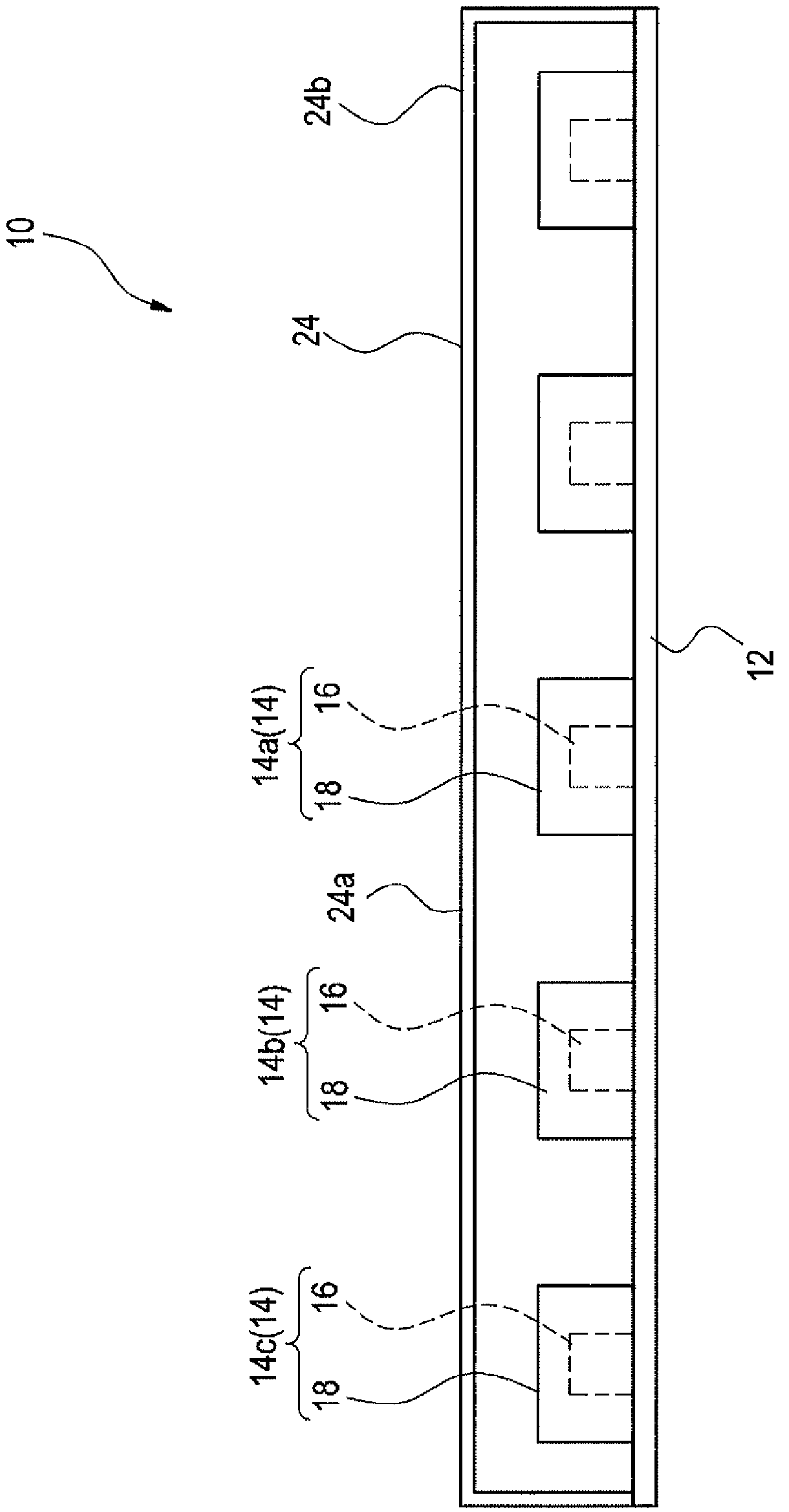
FIG. 2 is a sectional side view of the illumination device of FIG. 1.

As shown in FIG. 2, the center light-emitting device 14*a*, the middle light-emitting devices 14*b*, and the outer light-emitting devices 14*c* each include an LED (light-emitting element) 16 that emits blue light in a wavelength range of approximately 380 to 480 nm; and an enclosure 18 that seals the LED 16.

The enclosure 18 may be formed of resin (for example, silicon or epoxy, or the like) and further include a phosphor about the LED 16. The phosphor is excited by the blue light (in a wavelength range of approximately 380 to 480 nm) emitted from the LED 16 and converts the blue light into light in a wavelength range of approximately 480 to 780 nm. Such a phosphor may be of a white type including a yellow color. A combination ratio of this phosphor may be adjusted to vary the plurality of light-emitting devices 14 in a color temperature.

With the plurality of light-emitting devices 14 as described, a portion of the blue light emitted from the LED 16 excites a light-emitter and is converted into light within a wavelength range of approximately 480 to 780 nm, and the rest of the blue light remains unconverted and is transmitted through the resin case 18.

Through combining of the light in a wavelength range of approximately 480 to 780 nm obtained through the conversion and the blue light in a wavelength range of approximately 380 to 480 nm, conversion into a desired light color (for example a pseudo white) is made.

Figure 3:
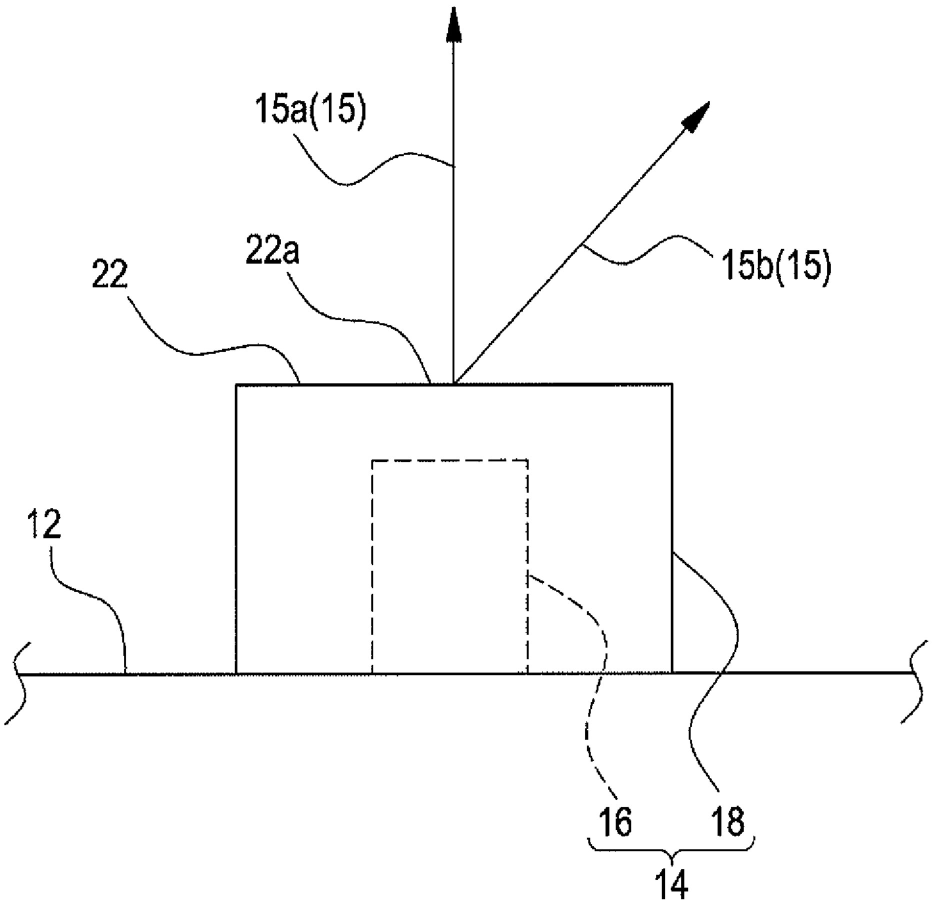
FIG. 3 is a sectional side view of a light-emitting device of the illumination device of FIG. 1.

Referring now to FIG. 3, the plurality of light-emitting devices 14 may have different tints depending on an irradiation direction.

More specifically, in the plurality of light-emitting devices 14, emitted light 15 turns into bluish-white light 15*a* in the vicinity of a center 22*a* of an irradiation surface 22 and turns into more yellowish light 15*b* with a distance from the center 22*a*. Thus, the plurality of light-emitting devices 14 each appear to have a yellow ring generated at the outer circumference of the light-emitting devices 14 (or of the resin case 18).

In other words, the plurality of light-emitting devices 14 each have a high color temperature associated with the vicinity of the center 22*a* of the irradiation surface 22 and have a lower color temperature associated with a distance from the center 22*a*.

The light-emitting devices 14 as shown in FIG. 2 are arranged with the color temperature varied (more specifically, increased) in a phased manner from the center of the substrate 12 toward the outer circumference thereof (and with a corresponding distance from the center thereof) by adjusting a combination ratio of the light-emitter included in the resin case 18.

More specifically, the color temperature of the middle light emitting devices 14*b* of the plurality of light emitting devices 14 is set higher than the color temperature of the center light emitting device 14*a* of the plurality of light emitting devices 14 and the color temperature of the outer light emitting devices 14*c* of the plurality of light emitting devices 14 is set higher than the color temperature of the middle light emitting devices 14*b*.

Consequently, on an irradiation surface 24 (see FIG. 2) of the illumination device 10, a color temperature at an outer circumferential portion 24*b* can be brought closer to a color temperature at a more central portion 24*a*. Bringing the color temperature at the outer circumferential portion 24*b* of the irradiation surface 24 of the illumination device 10 closer to the color temperature at the center portion 24*a* thereof in this manner can reduce an appearance of color unevenness on the irradiation surface 24. In addition, bringing the color temperature at the outer circumferential portion 24*b* of the irradiation surface 24 closer to the color temperature at a center portion thereof to reduce the color unevenness may eliminate a need for subjecting light emitted from the plurality of light emitting devices 14 to diffusion processing with a reflection plate or a lens. In this case, a decrease in light extraction efficiency may be avoided.

Additional embodiments may further be described with reference to FIGS. 4 to 8. Similar features for the additional embodiments may be shown and provided with the same numerals as shown in FIG. 1, and thus they are omitted from the description.

Figure 4:
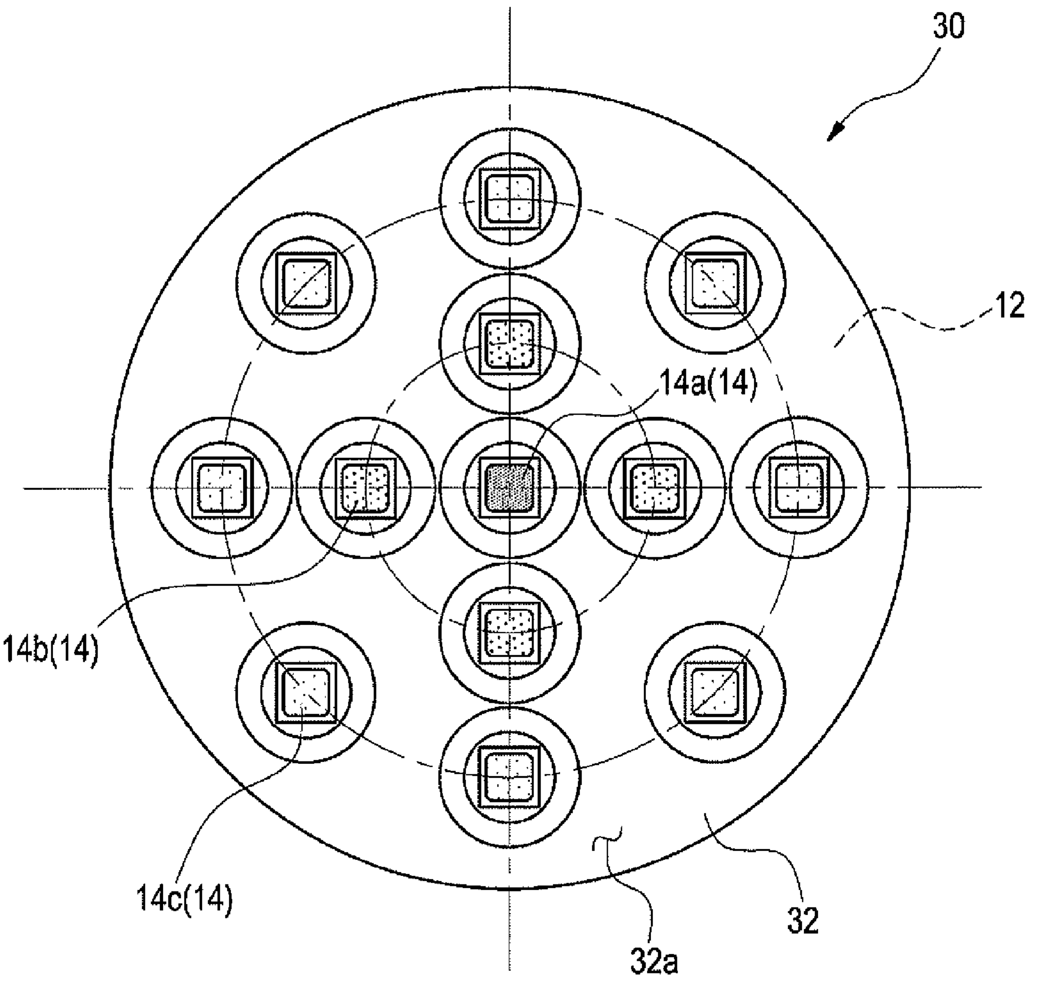
FIG. 4 is a top view of an illumination device in accordance with a second embodiment of the present invention.

Referring now to FIG. 4, an alternative embodiment of an illumination device 30 has a reflection plate 32 provided in what otherwise is equivalent to the illumination device 10 as shown in FIG. 1. The reflection plate 32 has a reflection surface 32*a* which is provided on a surface facing a plurality of light emitting devices 14 and which performs a light distribution control of light emitted from the plurality of light emitting devices 14.

Consequently, light emitted from the plurality of light emitting devices 14 can be subjected to the light distribution control in a desired direction with the reflection surface 32*a*, thus providing high illumination intensity, which facilitates achieving a higher output.

It may be assumed that, when the reflection plate 32 is used for obtaining high illumination intensity, a problem of appearance of color unevenness becomes more prominent. However, as is the case with the previously described embodiment of the illumination device 10, varying the plurality of light emitting devices 14 in a color temperature can reduce an appearance of color unevenness on an irradiation surface 22 and also can avoid a decrease in light extraction efficiency.

Figure 5:
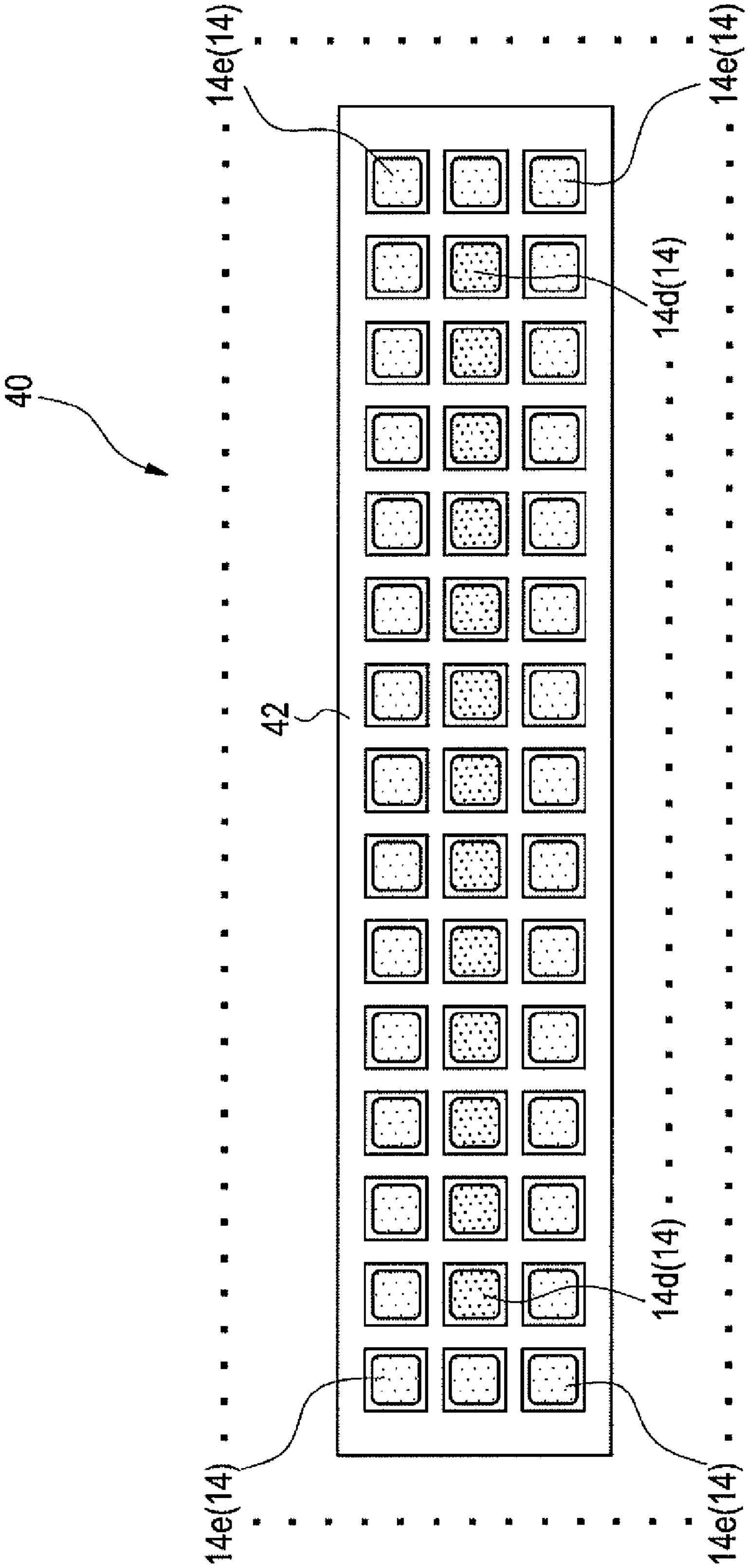
FIG. 5 is a top view of an illumination device in accordance with a third embodiment of the present invention.

Referring now to FIG. 5, in another embodiment an illumination device 40 is provided with a substrate 42 formed into a rectangular shape, and a plurality of light emitting devices 14 mounted on the substrate 42.

The illumination device 40, as is the case with the embodiment of the illumination device 10 as shown in FIG. 1, is arranged with a color temperature varied (more specifically, increased) in a phased manner from a center of the substrate 42 toward an outer edge thereof (with distance from the center thereof) by adjusting a combination ratio of a light-emitter included in the resin case 18 of the plurality of light emitting devices 14. More specifically, the color temperature of outer light-emitting devices 14*e* of the plurality of light emitting devices 14 is set higher than a color temperature of center light-emitting devices 14*d* of the plurality of light emitting devices 14.

Consequently, as is the case with the illumination device 10 as shown in FIG. 1, an appearance of color unevenness on an irradiation surface can be reduced, and a decrease in light extraction efficiency can be avoided.

Figure 6:
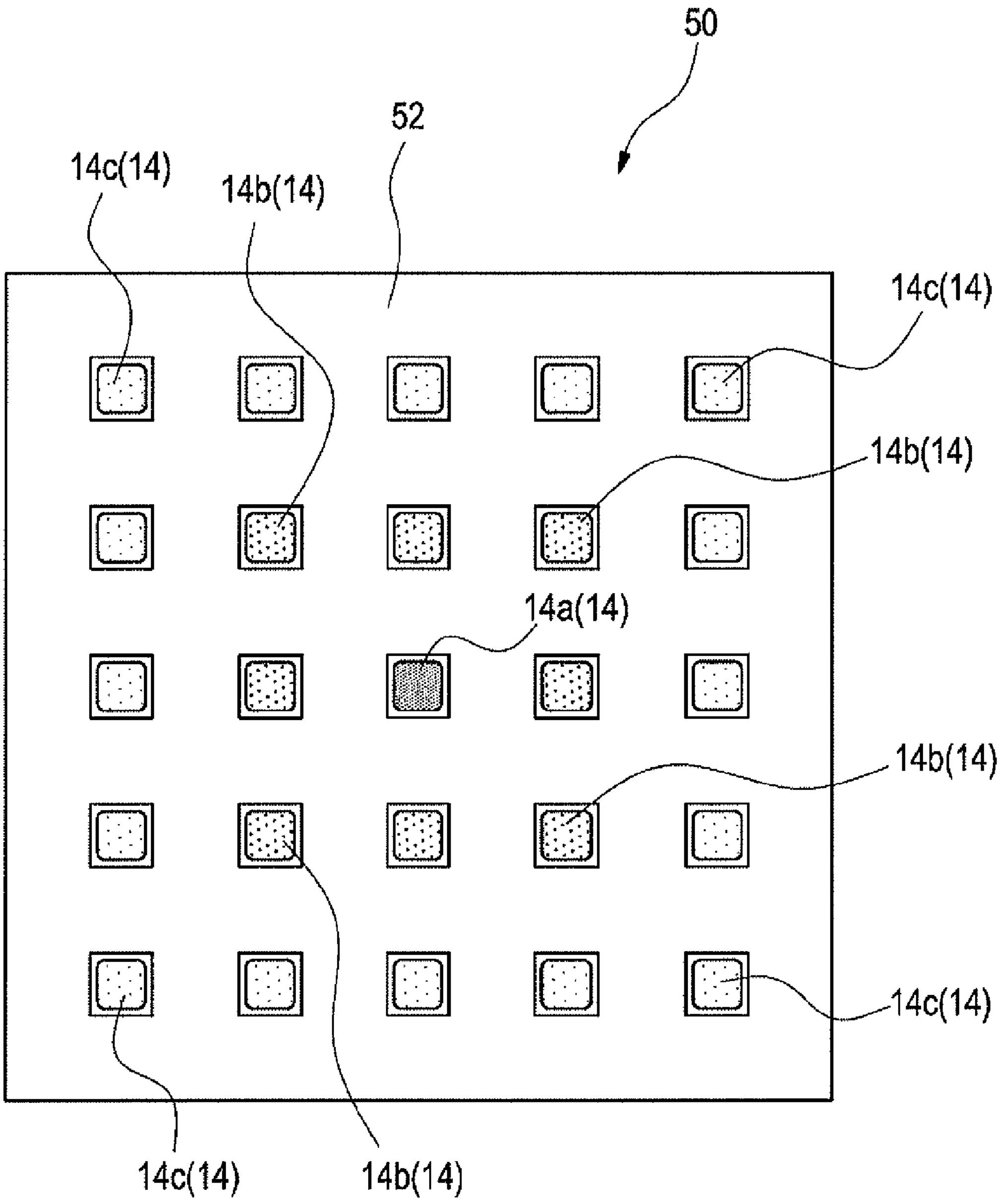
FIG. 6 is a top view of an illumination device in accordance with a fourth embodiment of the present invention.

Referring now to FIG. 6, in another embodiment an illumination device 50 is provided with a substrate 52 formed into a square shape and a plurality of light emitting devices 14 mounted on the substrate 52.

The illumination device 50, as is also the case with the illumination device 10 as shown in FIG. 1, is arranged with a color temperature varied (more specifically, increased) in a phased manner from a center of the substrate 52 toward an outer edge thereof (with a corresponding distance from the center thereof) by adjusting a combination ratio of a light-emitter included in the resin case 18 of the plurality of light emitting devices 14.

More specifically, a color temperature of middle light-emitting devices 14*b* of the plurality of light emitting devices 14 is set higher than the color temperature of the center light-emitting device 14*a* of the plurality of light emitting devices 14, and a color temperature of outer light-emitting devices 14*c* of the plurality of light emitting devices 14 is set higher than the color temperature of the middle light-emitting devices 14*b*. Consequently, as is the case with the illumination device 10 as shown in FIG. 1, an appearance of color unevenness on an irradiation surface can be reduced, and a decrease in light extraction efficiency can be avoided.

Figure 7:
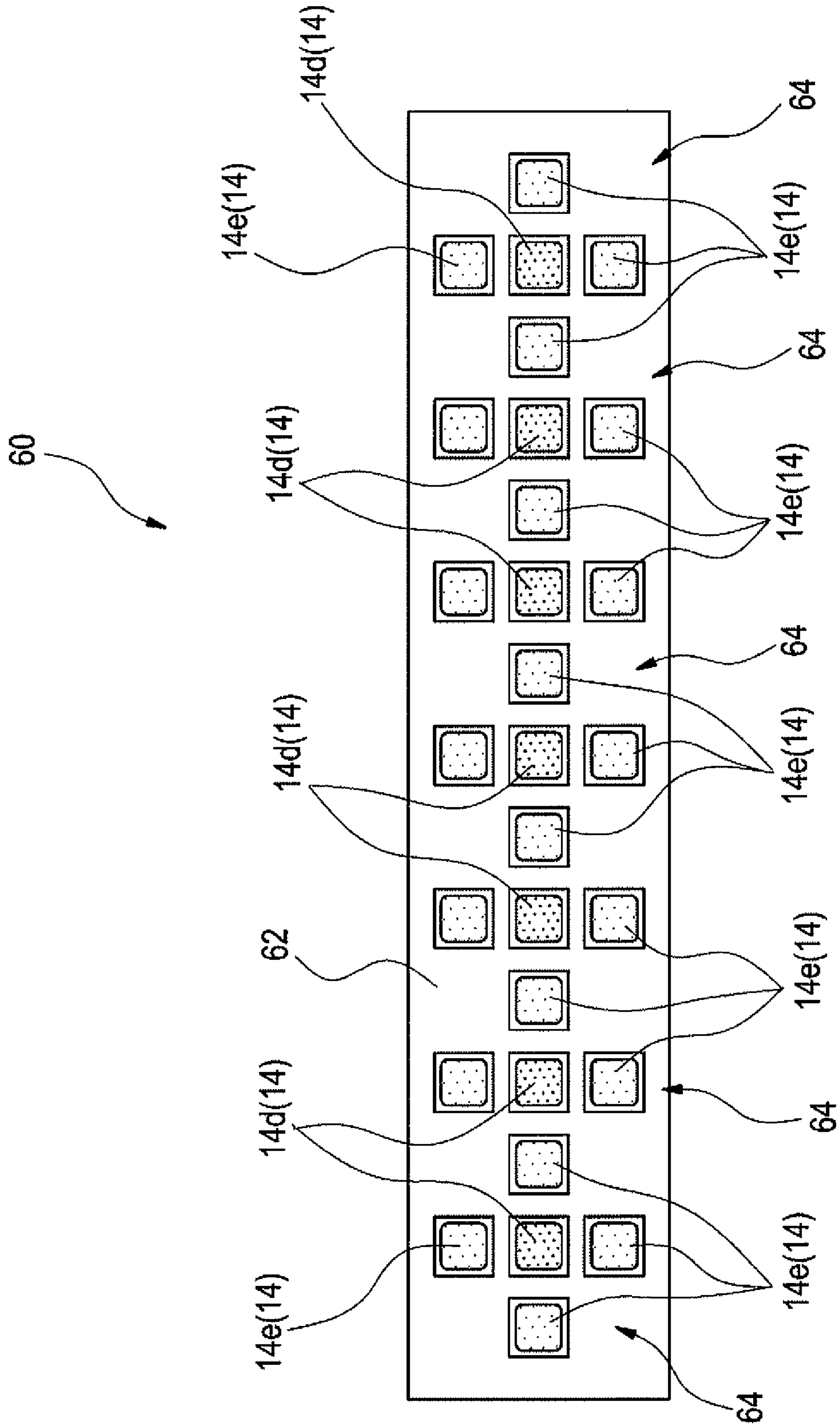
FIG. 7 is a top view of an illumination device in accordance with a fifth embodiment of the present invention.

Referring now to FIG. 7, in another embodiment an illumination device 60 is provided with a substrate 62 formed into a rectangular shape and a plurality of light emitting devices 14 mounted on the substrate 62.

The plurality of light emitting devices 14 are provided by providing in a continuous manner one or more light-emitting units 64 each having a plurality of outer light-emitting devices 14*e* with a high color temperature so arranged as to surround a center light-emitting device 14*d*.

Note that the adjacent light-emitting units 64 share the outer light-emitting device 14*e* with the high color temperature. Since the light-emitting unit 64 has the plurality of outer light-emitting devices 14*e* with the high color temperature arranged around the center light-emitting device 14*d*, an appearance of color unevenness at the light-emitting unit 64 can be avoided.

Providing light-emitting units 64 in a continuous manner, as is the case with the illumination device 10 shown in FIG. 1, can reduce an appearance of color unevenness on an irradiation surface, and can avoid a decrease in light extraction efficiency. In addition, providing the light-emitting units 64 in a continuous manner permits the illumination device 60 to be formed into any shape such as a rectangle, thus facilitating a broader scope of potential applications for the illumination device 60.

Figure 8:
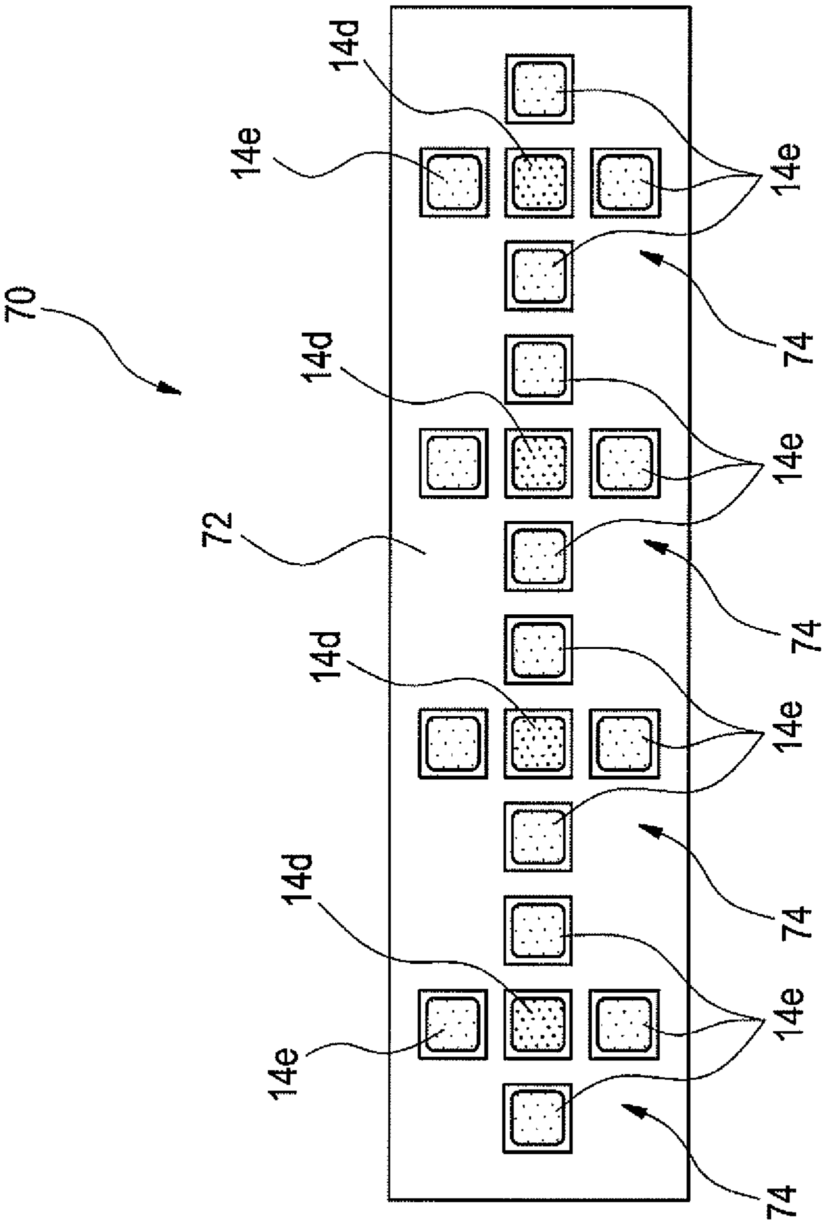
FIG. 8 is a top view of an illumination device in accordance with a sixth embodiment of the present invention.

Referring now to FIG. 8, in another embodiment an illumination device 70 is provided with a substrate 72 formed into a rectangular shape and a plurality of light emitting devices 14 mounted on the substrate 72.

The plurality of light emitting devices 14 are provided by plurally providing in a continuous manner a light-emitting unit 74 having a plurality of outer light-emitting devices 14*e* with the high color temperature so arranged as to surround a center light-emitting device 14*d*. Since the light-emitting unit 74 has the plurality of outer light-emitting devices 14*e* with the high color temperature arranged around the center light-emitting device 14*d*, an appearance of color unevenness at the light-emitting unit 74 can be avoided.

Providing this light-emitting unit 74 in a continuous manner, as is the case with the illumination device 10 as shown in FIG. 1, can reduce an appearance of color unevenness on an irradiation surface, and can avoid a decrease in light extraction efficiency. In addition, plurally providing the light-emitting unit 74 in a continuous manner permits the illumination device 70 to be formed into any shape such as a rectangle, thus widening its use.

Note that the illumination devices of the present invention are not limited to the embodiments described above, and thus can be modified or improved when appropriate. For example, the LED 16 that emits blue light is illustrated as a light-emitter, but an LED of a different type can also be used.

Moreover, the phosphor is of a white type including a yellow color, although it is not limited thereto.

As an example of arranging the plurality of light emitting devices 14 with a color temperature varying in a phased manner from the center of the substrate toward an outer circumference thereof, the color temperature is increased in a phased manner, although it is not limited thereto.

Furthermore, the shapes of the substrates 12, 42, 52, 62, and 72, the light emitting devices 14, the LED (light-emitter) 16, the resin case 18, etc. are not limited to those illustrated, and thus can be modified when appropriate.

Thus, although there have been described particular embodiments of the present invention of a new and useful Illumination Device having Multiple LED Elements With Varying Color Temperatures it is not intended that such references be construed as limitations upon the scope of this invention except as set forth in the following claims.

What is claimed is:

1. An illumination device comprising:

a planar substrate;

a plurality of first light-emitting devices of a first color temperature arranged on a first direction of the planar substrate and separated from each other by a first distance;

a plurality of second light-emitting devices of a second color temperature arranged on the planar substrate and circumferentially disposed about the plurality of first light-emitting devices and separated from each other by a second distance without any additional light-emitting device disposed in the second distance;

wherein the second color temperature is higher than the first color temperature;

wherein at least two of the plurality of second light-emitting devices are disposed in the first distance;

wherein each of the plurality of first light-emitting devices and the plurality of second light emitting devices further independently comprising:

a light emitting element, and a resin including a phosphor sealing the light emitting element.

2. The illumination device of claim 1, wherein the light emitting element is a blue light emitting element.

3. An illumination device comprising:

a planar substrate including an inner portion and an outer portion circumferentially disposed about the inner portion;

a plurality of first light-emitting devices of a first color temperature arranged in the inner portion;

a plurality of second light-emitting devices of a second color temperature arranged in the outer portion and separated from each other by a second distance without any additional light-emitting device disposed in the second distance;

wherein the second color temperature is higher than the first color temperature.

4. The illumination device of claim 3, wherein each of the plurality of first light-emitting devices and the plurality of second light-emitting devices further comprising:

a light-emitting element; and a resin including a phosphor sealing the light-emitting element.

5. The illumination device of claim 3, wherein the plurality of first light-emitting devices are separated from each other by a first distance, and wherein at least two of the plurality of second light-emitting devices are disposed in the first distance.

6. The illumination device of claim 4, wherein the light emitting element is a blue light emitting element.

* * * * *